United States Patent [19] [11] Patent Number: 4,786,825
O'Shaughnessy et al. [45] Date of Patent: Nov. 22, 1988

[54] CMOS SCHMITT TRIGGER CIRCUIT USING RATIOED CURRENTS TO ESTABLISH SWITCHING THRESHOLDS

[75] Inventors: Timothy O'Shaughnessy, Yorba Linda; Victor G. Pierotti, Anaheim; Brian A. Wey, Fountain Valley, all of Calif.

[73] Assignee: Western Digital Corporation, Irvine, Calif.

[21] Appl. No.: 945,310

[22] Filed: Dec. 22, 1986

[51] Int. Cl.[4] .......................... H03K 3/29; H03K 3/26; H03K 19/094

[52] U.S. Cl. ................................... 307/290; 307/451; 307/464; 307/279

[58] Field of Search .............. 307/451, 464, 279, 357, 307/290

[56] References Cited
FOREIGN PATENT DOCUMENTS 0208941 11/1984 Japan ................................. 307/451

Primary Examiner—John Zazworsky
Assistant Examiner—M. R. Wambach
Attorney, Agent, or Firm—Spensley Horn Jubas & Lubitz

[57] ABSTRACT

A Schmitt trigger circuit incorporates an MOS transistor connected as an inverter and two switchable currents being provided as the load to the drain of the MOS transistor to determine the switching threshold. For the low-to-high switching threshold, both currents are supplied to the transistor to require a higher gate voltage to cause the transistor to conduct both currents. Once the transistor conducts both currents and the output switches high to low, one of the sources of current is removed to cause the switching threshold to be reduced to a specified low level. The two load currents are provided by two transistors which are connected in a current mirror configuration so that the ratio of the currents provided can be precisely controlled to achieve the desired switching thresholds for the Schmitt trigger circuit.

12 Claims, 2 Drawing Sheets $$V_K = \frac{R_3}{R_3+R_2} V_{DD}$$

CMOS SCHMITT TRIGGER CIRCUIT USING RATIOED CURRENTS TO ESTABLISH SWITCHING THRESHOLDS

BACKGROUND OF THE INVENTION

1. Field of the Invention

The present invention relates to Schmitt trigger circuits and more particularly to Schmitt trigger circuits utilizing CMOS (complementary metal oxide semiconductor) circuitry.

A Schmitt trigger is a circuit that provides an output signal of either logic-0 or logic-1 in response to an input signal. When the input signal crosses a specified threshold voltage (or current), the output changes to the other logic condition. When the logic condition changes on the output, the threshold voltage is also changed. The difference in threshold voltages is called hysteresis.

The basic operation of a Schmitt trigger circuit is illustrated in FIG. 1. Initially, the output is at logic-0. When the input voltage increases to a high switching threshold voltage VTH+, the output will change states to logic-1. Upon this change, the switching threshold of the Schmitt trigger circuit will be changed from VTH+ to a lower threshold VTH−. Therefore, in order to switch back to a logic-0 output, the input voltage must fall below VTH−.

There are at least two applications of the Schmitt trigger. First, when properly used the Schmitt trigger reduces errors in digital systems due to noise on the input signal. The reduction in errors occurs because once the input has switched and the threshold voltage changed, the input voltage must cross both threshold voltages to produce a logic change on the output. If the magnitude of the noise is less than the hysteresis of the Schmitt trigger, then the circuit will not respond to the noise.

In a second application, the Schmitt trigger provides a fast transition on the output, even to slow changes on the input. Therefore, the circuit is useful in waveform generation, such as sine wave to square wave converters, and for pulse generation.

2. Description of the Prior Art

CMOS circuits have been used in the past to fabricate Schmitt triggers. One technique provides a circuit which requires a very small power supply current. This circuit is shown in FIG. 2. It includes an input stage including a CMOS inverter formed of an N-channel field effect transistor N1 and a P-channel field effect transistor P1, and a diode connected transistor N2. The diode increases the switching threshold voltage of the input inverter for the high switching threshold VTH+, and the diode is shorted to obtain VTH−. The control of the diode is by means of an N-channel transistor N3 driven by the output of the Schmitt trigger circuit. This output is derived from a second inverter comprised of transistors P3 and N4 coupled to the output of the first inverter.

The Schmitt trigger thresholds VTH+ and VTH− of the circuit of FIG. 2 are determined by the switching thresholds of the transistors N1 and N2. A primary disadvantage of the circuit is that the switching thresholds of the transistors cannot be controlled precisely enough in order to ensure that the circuit will be compatible with TTL (transistor-transistor logic) circuits. Many circuits employ TTL, and it is highly desirable when designing a Schmitt trigger that it be able to be used with TTL circuits. A general requirement for TTL compatibility in a Schmitt trigger circuit is that it must accept anything less than 0.8 volts to cause it to switch to a logic-0 output and must accept anything greater than 2.0 volts to cause it to switch to a logic-1 output. In the circuit of FIG. 2, the combined thresholds of the transistors N1 and N2 may exceed 2 volts, with the result being that the switching threshold for the logic-1 state would be greater than 2 volts (the input voltage must exceed the sum of the thresholds of N1 and N2 in order to switch) and the circuit would therefore not be TTL compatible.

SUMMARY OF THE INVENTION

The present invention is directed to a Schmitt trigger circuit in which the switching threshold is not determined by summing the threshold voltages of two transistors. Instead, the input signal is applied to an MOS transistor which is supplied at its drain with one of two load currents of different values. The value of the load current determines the switching level of the transistor and is switched between a high and low level depending on the logic condition on the Schmitt trigger output.

In one embodiment of the invention, the output of the transistor is connected to a CMOS inverter, the output of which is the output of the Schmitt trigger circuit. A first supply transistor provides a load current to the drain of the input transistor. A second supply transistor is connected to selectively supply current in addition to that supplied by the first supply transistor, depending on the output of the inverter. The current from the first supply transistor determines the low switching threshold of the Schmitt trigger circuit, and the sum of the currents from the first and second supply transistors determines the high switching threshold. The ratio of currents from the first and second supply transistors, and therefore the hysteresis of the circuit, can be precisely controlled by current mirror techniques.

In addition to the basic configuration in which the switching threshold and therefore hysteresis of the Schmitt trigger circuit is controlled by controlling the value of drain current to an input transistor, additional circuit elements may be added to further reduce power consumption of the circuit. In addition, various current mirror techniques may be employed to precisely control the values of drain current to the input transistor.

BRIEF DESCRIPTION OF THE DRAWINGS

The invention will be described with reference to the accompanying drawings wherein.

DETAILED DESCRIPTION OF THE DRAWINGS

The following description is of the best presently contemplated mode of carrying out the invention. This description is made for the purpose of illustrating the general principles of the invention and is not to be taken in a limiting sense. The scope of the invention is best determined by reference to the accompanying claims.

Figure 1:
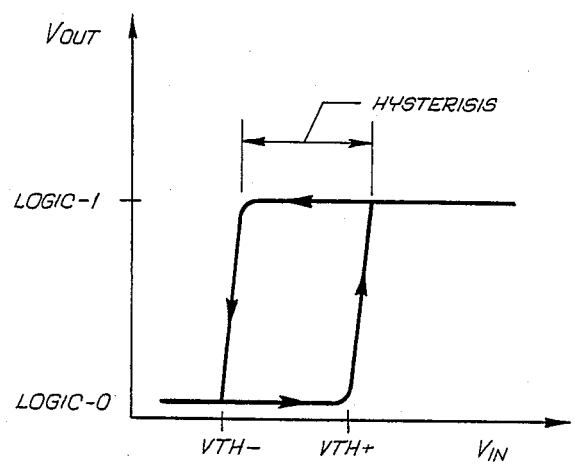
FIG. 1 is a diagram showing the basic operation of a Schmitt trigger circuit.
Figure 2:
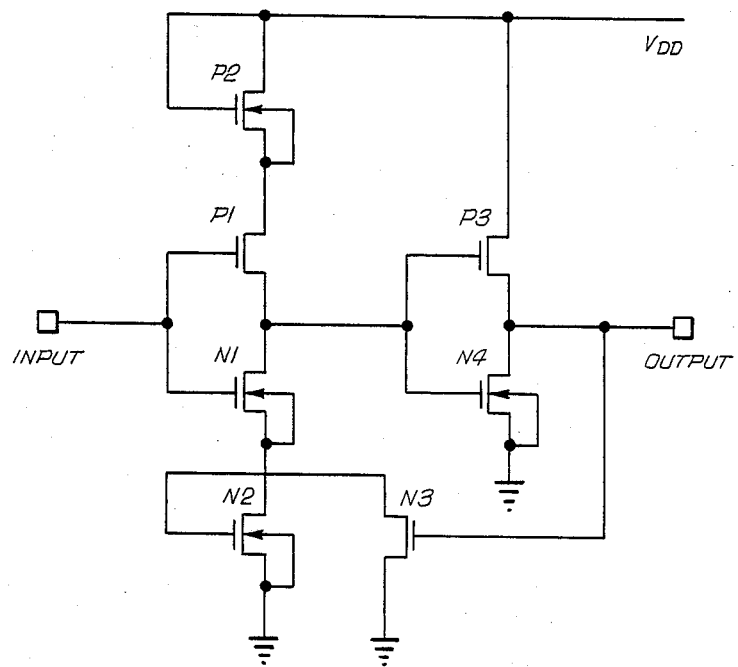
FIG. 2 is a schematic diagram of a prior art Schmitt trigger circuit.
Figure 3:
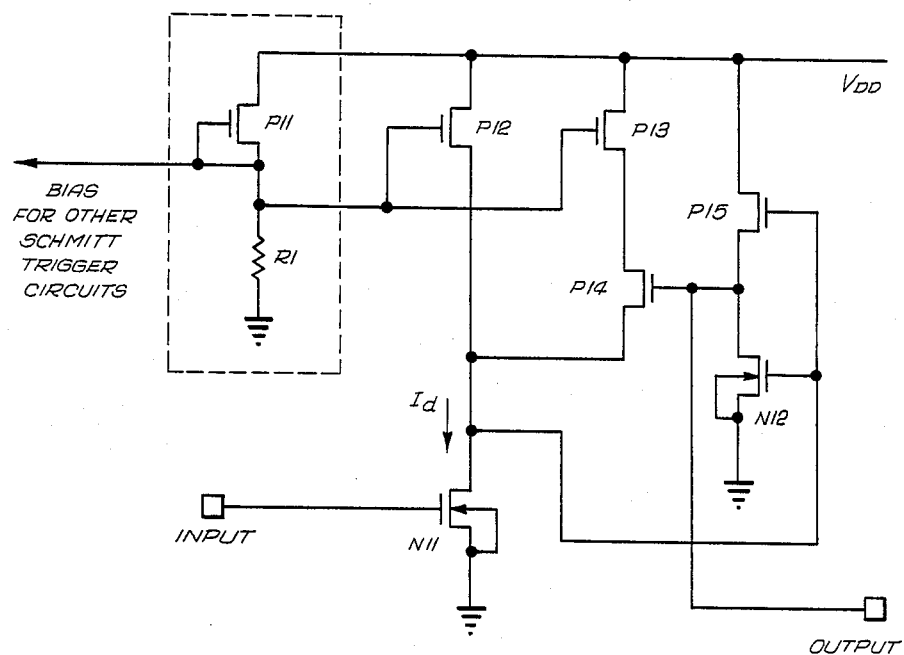
FIG. 3 is a schematic diagram of the Schmitt trigger circuit of the present invention.

FIG. 3 shows the basic structure of the Schmitt trigger circuit of the present invention. In this circuit, an input signal is applied to an N-channel MOS input transistor N11. The drain of N11 is coupled to the drain of a P-channel supply transistor P12 and a P-channel control transistor P14 which is in turn coupled to a second P-channel supply transistor P13.

The drain of the input transistor N11 is connected to the input of a CMOS inverter formed of an N-channel transistor N12 and a P-channel transistor P15. The output of the inverter is the output of the Schmitt trigger circuit and also serves to drive the gate of the transistor P14.

A control circuit including a P-channel transistor P11 and a resistor R1 operates to provide a fixed bias voltage to drive the gates of the transistors P12 and P13. This causes each of the transistor to provide a fixed drain current. The transistors P11, P12 and P13 are connected in a current mirror configuration, and the drain currents of the transistors P12 and P13 will thus be proportional to each other in accordance with their relative dimensions.

Assuming the input voltage is initially low, the transistor N11 will be off. P12 will be biased to supply a specific value of drain current. The drain of N11 will be at a high voltage level. This voltage is applied to the gates of transistors N12 and P15. This causes the transistor N12 to conduct and the interconnected drains of N12 and P15 (the outpu of the Schmitt trigger circuit) will be low. This low voltage is applied to the gate of the transistor P14, thus rendering it conductive, and the fixed drain current of the transistor P13 will therefore be applied to the drain of the transistor N11. Thus, two current sources, namely P12 and P13, are coupled to the drain of N11 when the output of the Schmitt trigger is low.

In order for the input transistor N11 to switch from high to low the input voltage must rise to a level at which the drain current of the transistor N11 exceeds the current supplied by the transistors P12 and P13. The drain current of N11 is a function of the input voltage, i.e., for a particular value of gate-to-source voltage Vg a particular value of drain current Id will be provided. Therefore, in order to achieve a desired switching threshold, the drain current supplied by the transistors P12 and P13 must be accurately controlled to achieve a desired drain current to N11, and establish the input switching threshold voltage of transistor N11. This is accomplished by the current mirror circuitry which will be described in more detail subsequently.

Once the input voltage rises to a level sufficient to cause the transistor N11 to conduct the total current, the drain voltage switches from high to low. This in turn causes the N-channel transistor N12 to turn off and the P-channel transistor P15 to turn on, thus causing the interconnected drains (the Schmitt trigger output) to rise to a high level. Thus, the output of the Schmitt trigger will switch from low to high once the input voltage rises to a level at which the drain current of N11 exceeds the sum of the drain currents of P12 and P13.

When the output of the Schmitt trigger circuit goes high, the control transistor P14 will be turned off, thus preventing the drain current of P13 from being applied to the drain of N11. At this point, only the drain current of P12 will be applied to N11, and N11 will therefore remain conductive until the input voltage falls to a level such that the drain current of N11 is less than the drain current of P12. This drain current corresponds to an input voltage which is equal to the desired low switching threshold for the Schmitt trigger circuit. Once the transistor N11 turns off, the inverter made up of transistors N12 and P15 is again switched, causing the output of the Schmitt trigger to return to its low level and the drain current of P13 to be recoupled to the drain of N11.

It can be seen that in order to accurately control the switching threshold of the Schmitt trigger circuit, the drain currents provided by the transistors P12 and P13 must be accurately controlled. This is accomplished by using current mirror techniques, which enables the ratio of currents of two transistors to be controlled very accurately by controlling the relative sizes of the transistors, i.e., the channel width and channel length of the transistors. In FIG. 3, the transistors P12 and P13 are connected in a current mirror configuration to the transistor P11, i.e., the gates of each of the transistors are interconnected and their sources are connected to the power supply VDD. By applying an identical gate drive voltage to each of the transistors, their drain currents will be proportional to their relative sizes. The drain current of the transistor P11 is accurately determined by means of the resistor R1. This resistor may be formed on the integrated circuit (diffused or polysilicon) along with the transistors of the circuit or may be an external resistor. The voltage across R1 determines the current of P11 which develops the gate drive voltage of transistors P11, P12 and P13. The transistor P12 is of a size such that it will provide the desired current to the transistor N11 to determine the low switching threshold of the Schmitt trigger circuit, and the transistor P13 is of a size to provide an additional current such that the sum of the drain currents of P12 and P13 will provide the desired current necessary to set the high switching threshold of the Schmitt trigger circuit.

Figure 4:
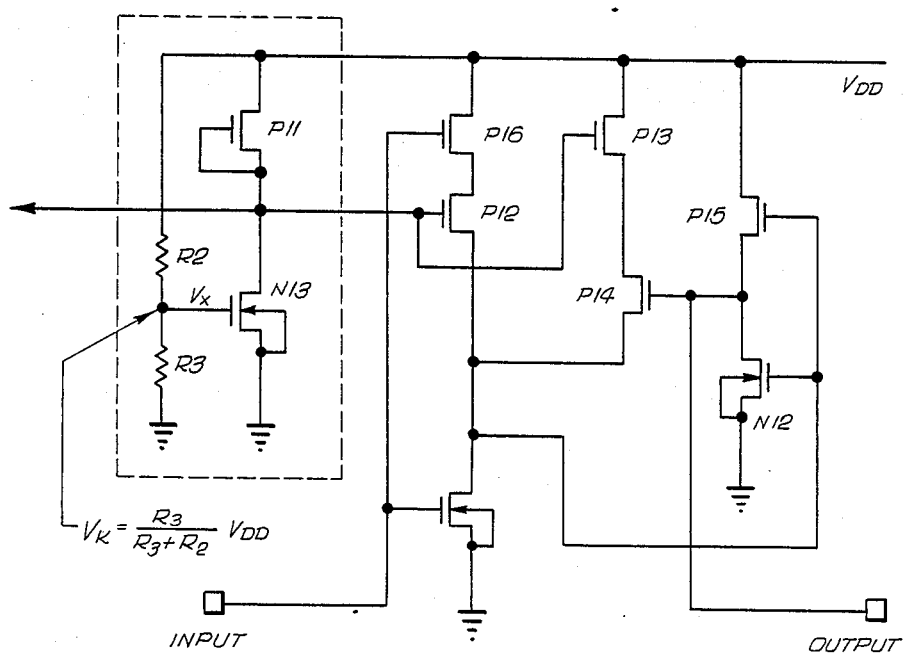
FIG. 4 is a schematic diagram of a further embodiment of the Schmitt trigger circuit of the present invention.

The circuit of FIG. 3 requires a minimum number of components to achieve the desired operation. FIG. 4 illustrates a circuit in which somewhat improved operation is achieved with a small additional number of components. Elements in FIG. 4 which correspond to those in FIG. 3 are identified similarly. In FIG. 4, an additional P-channel transistor P16 is provided between the power supply VDD and the transistor P12 (and could also be connected between the power supply and the transistor P13). The gate of the transistor P16 is coupled to the input of the Schmitt trigger circuit. The addition of this transistor serves to reduce power consumption. In the circuit of FIG. 3, the circuit requires power supply current when the transistor N11 is on. In the circuit of FIG. 4, however, when the input approaches the supply voltage VDD (after the transistor N11 has turned on) the transistor P16 will turn off, thus reducing power consumption. The transistor P16 will resume conducting prior to the input signal falling back to the low switching threshold, and therefore will not effect the basic Schmitt trigger operation.

FIG. 4 also illustrates a control circuit which is different from that of FIG. 3. The control circuit is independent from the provision of the transistor P16, i.e., the transistor P16 could be employed in a Schmitt trigger employing the control circuit of FIG. 3 as well as that shown in FIG. 4. The bias circuit of FIG. 4 is comprised of two resistors R2 and R3 and an N-channel transistor N13 connected in series with the transistor P11. The resistors R2 and R3 form a voltage divider to provide a gate voltage Vx to the transistor N13. This circuit configuration serves to set the logic-1 switching threshold VTH+ at a desired level. The transistors P11, P12 and P13 are fabricated so that the sum of the ratios of the channel width to channel length of the transistors P12 and P13 is equal to the ratio of the channel width to channel length of the transistor P11. Thus, $$(W/L)P12 + (W/L)P13 = (W/L)P11$$

In addition, the transistors N11 and N13 are fabricated to have the same dimensions, i.e., the same ratio of channel width to channel length. When the input voltage is at a logic-0 level, P12 and P13 are biased to provide a total drain current which is equal to the drain current of P11, which in turn is equal to the drain current of N13. Therefore, the drain current of N13 is balanced to the drain current of P12 and P13 when the input voltage is approximately equal to Vx. The logic-1 switching threshold is thus equal to Vx.

The circuit of FIG. 4 enables a specific switching threshold to be realized by selection of the resistors R2 and R3. Variation of switching thresholds due to processing and operating conditions is reduced as compared to the circuit of FIG. 3. Alternatively, two series connected MOS transistors of the same polarity coupled between the power supply and ground and having their gates connected to their drains may be provided instead of the resistors. The voltage Vx will be provided at the connection between the transistors. Also a band gap voltage reference could be employed instead of a voltage divider to drive the transistor N13.

It should be noted that only a single control circuit is required to establish the bias voltage for any number of Schmitt trigger circuits contained on a single chip. This further reduces the cost of fabrication of a chip when more than one Schmitt trigger circuit is required.

The manner in which the switching thresholds are determined and controlled will be described with reference to a particular design example. The input transistor N11 operates as a MOS inverter. The logic switching threshold of the inverter occurs when the gate input voltage Vg increases to a value large enough that the transistor N11 sinks the load current Id, or when the gate voltage decreases to a value insufficient for the transistor N11 to sink the load current. This drain current of the MOS transistor N11 operating in the "saturated square law region" is predicted by the following equation.

$$Id = (K'/2) \times (W/L) \times (Vg - Vt)^2$$

where K' and Vt are determined by the process and Vt is the threshold voltage of the transistor N11.

For the high-to-low logic transition and for an established process, the worse case minimum logic-0 switching threshold voltage occurs at a minimum value of Vt for N11, minimum load current and maximum K'. Therefore, a particular W/L for the transistor N11, the minimum drain current Id(h−1) necessary to achieve a specified minimum logic threshold voltage under such worse case conditions can be determined. In a particular design example, the specific worse case design parameters have the following values:

W/L = 10
K' = 56 uA/v²
Vt = 0.75 volts
VINL (specified logic threshold for high to low transition) = 1.0 volts
Therefore $$Id(h-1)(min) = (56E-6/2) \times (10) \times (1-0.75)^2 = 17.5 \; uA$$

Thus, the transistor P12 must supply a load current of 17.5 uA to the drain of the transistor N11. This value of load current is obtained by means of the current mirror using the bias circuit of either FIG. 3 or FIG. 4.

The circuit must also be controlled to achieve the desired maximum logic-1 switching threshold, i.e., the low-to-high transistion of the circuit. The maximum logic-1 switching threshold voltage occurs at minimum K' (for N11), maximum Vt (for N11) and maximum anticipated load current Id (1-h). In the particular design example, the following specific worst case values are used to calculate the maximum anticipated load current:

W/L = 10
K' = 48 uA/v²
Vt = 0.95 volts
VINH (specified logic threshold for low to high switching) = 2.0 volts The drain current can therefore be calculated from the equation above as follows:

$$Id(1-h)(max) = (48E-6/2) \times (10) \times (2-0.95)^2 = 264 \; uA$$

Thus, a logic-1 switching threshold of 2.0 volts maximum will be obtained with a drain current of 264 uA, which is provided by the combination of the transistors P12 and P13.

The minimum acceptable current for achieving the specified high-to-low switching threshold and the maximum specified current for achieving the low-to-high switching threshold are obtained under different conditions. In order to select the size ratios between the transistors P12 and P13, the currents must be compared at similar operating conditions. Therefore, the value of Id (h−1)(min) must be projected to maximum conditions to enable it to be compared to the calculated value of Id (1−h)(max), or vice versa. In the present example, the drain current Id(h−1) of 17.5 uA for minimum conditions translates to a value of 55.74 uA under processing conditions and factors at the other extreme (i.e., the same conditions as exist when Id (1−h)(max) is obtained). The value Id (1−h)(max)/Id (h−1)(max) is a fixed ratio obtained from (IP12 + IP13)/IP12. This ratio is realized by the ratio of channel widths of the transistors P12 and P13, namely (WP13 + WP12)/WP12. Therefore, the ratios of channel widths of P12 and P13 is as follows:

$$WP13/WP12 = [Id(1-h)(max)/Id(h-1)(max)] - 1$$

In this particular design example this results in WP13/WP12 = 3.736. Therefore, the overall design is based on meeting acceptable logic switching threshold voltages under worse case conditions.

In summary, the present invention employs an MOS transistor connected as an inverter and supplied with one of two different drain currents as its load to control the switching thresholds of a Schmitt trigger circuit. Precise switching thresholds can be obtained with an extremely simple circuit design.

I claim:
1. A Schmitt trigger circuit comprising:

a first MOS field effect transistor having its source connected to ground, an input signal applied to its gate and having a switching threshold controlled by the drain current thereof, wherein the first transistor functions as an inverter;

a CMOS inverter being its input connected to the drain of the first transistor, wherein the output of the inverter is the output of the Schmitt trigger circuit;

switchable drain current supply means controlled by the output of the CMOS inverter for providing a drain current of a first or second value to the drain of the first transistor to control the switching threshold thereof, wherein when the output of the CMOS inverter is at a first level the drain current will have the first value and when the output of the CMOS inverter is at a second level the drain current will have the second value, thereby providing hysterisis to the circuit, said drain current having a first component and second component wherein said first component of drain current establishes said first value of drain current and wherein said first and second components add to establish said second value of drain current; and a biasing circuit coupled to said current supply means for biasing said first and second components to have a predetermined relationship to one anther.

2. A circuit as in claim 1 wherein the drain current supply means comprises:

a power supply;

a second MOS transistor driven by the biasing circuit and connected between the power supply and the drain of the first transistor for supplying said first component of the drain current to the first transistor;

a third MOS transistor driven by the biasing circuit and having its source connected to the power supply for supplying said second component of the drain current to the first transistor; and a fourth MOS transistor driven by the output of the CMOS inverter and connected between the drain of the third transistor and the drain of the first transistor, wherein the second transistor supplies the first component of drain current to said first transistor and wherein the third transistor supplies the second component of drain current when the fourth transistor is conductive.

3. A circuit as in claim 2 wherein said biasing circuit provides a fixed gate drive voltage to both the second and third transistors to provide said predetermined relationship between the first and second components of the drain current.

4. A Schmitt trigger circuit comprising:

a first MOS field effect transistor having its source connected to ground, an input signal applied to its gate and having a switching threshold controlled by the drain current thereof, wherein the first transistor functions as an inverter;

a CMOS inverter having its input connected to the drain of the first transistor, wherein the output of the inverter is the output of the Schmitt trigger circuit; and switchable drain current supply means controlled by the output of the inverter for providing a drain current of a first or second value to the drain of the first transistor to control the switching threshold thereof, wherein when the output of the inverter is at a first level to drain current will have the first value and when the output of the inverter is at a second level the drain current will have the second value, thereby providing hysterisis to the circuit, the drain current supply means comprising:

a second MOS transistor having its source connected to a power supply and its drain connected to the drain of said first transistor for supplying a first component of the drain current to the first transistor;

a third MOS transistor having its source connected to a power supply for supplying a second component of the drain current to the first transitor;

a fourth MOS transistor driven by the output of the CMOS inverter and connected between the drain of the third transistor and the drain of the first transistor, wherein the second transistor supplies the first component of drain current to establish the first value and wherein the third transistor supplies the second component of drain current when the fourth transistor is conductive, wherein the first and second components add to establish the second value of drain current; and control means for providing a fixed gate drive voltage to the gates of both the second and third transistors to provide a predetermined relationship between the first and second components of the drain current;

wherein the control means includes a fifth MOS transistor having a predetermined drain current, wherein said fifth transistor is connected to both the second and third transistors in a current mirror configuration, wherein the relative sizes of the second, third and fifth transistors are controlled to provide said predetermined relationship between the first and second components of the drain current.

5. A circuit as in claim 4 wherein the circuit includes a powers supply and wherein the control means includes:

a fifth MOS field effect transistor having its source connected to the power supply; and a resistor having one terminal connected to both the gate and drain of the fifth transistor and another terminal connected to ground thereby to provide a fixed bias voltage at the drain of the fifth transistor;

wherein said bias voltage is applied to the gates of the second and third transistors as said drive voltage.

6. A circuit as in claim 4 wherein the circuit includes a power supply and wherein the control means includes:

a voltage divider to provide a fixed control voltage;

a fifth MOS field effect transistor having its source connected to the power supply and its drain connected to its gate; and a sixth MOS field effect transistor having its source connected to ground, its drain connected to the drain of the fifth transistor and its gate connected to receive the fixed control voltage from the voltage divider, whereby the drain current of the fifth transistor is a predetermined value;

wherein the fifth transistor is connected to the second and third transistors in a current mirror configuration.

7. A circuit as in claim 6 wherein the voltage divider is comprised of first and second resistors.

8. A circuit as in claim 4 wherein the circuit includes a power supply and wherein the drain current supply means further includes a current control MOS field effect transistor having the source connected to the power supply, its drain connected to the source of the second transistor and its gate connected to receive the input signal, whereby drain current is supplied by the second transistor only when the current control transistor is conductive as determined by the input signal.

9. A Schmitt trigger circuit comprising:
   a first MOS field effect transistor of first conductivity type having its source connected to ground and an input signal applied to its gate;
   a complementary MOS inverter including a second MOS field effect transistor of first conductivity type having its source connected to ground and a third MOS field effect transistor of second conductivity type having its drain connected to the drain of the second transistor and its source coupled to a power supply, wherein the drain of the first transistor is connected to the gates of the second and third transistors and wherein the interconnected drains of the second and third transistors form the output of the inverter which is also the output of the Schmitt trigger circuit;
   a fourth MOS field effect transistor of second conductivity type having its gate connected to the output of the inverter and its drain connected to the drain of the first transistor;
   a fifth MOS field effect transistor of second conductivity type having its drain connected to the source of the fourth transistor and its source coupled to the power supply;
   a sixth MOS field effect transistor of second conductivity type having its drain connected to the drain of the first transistor and its source coupled to be supplied by the power supply; and
   bias means for controlling the value of drain currents of the fifth and sixth transistors, the bias means including a seventh MOS field effect transistor having its source coupled to the power supply and its drain connected to its gate and control means for controlling the drain current thereof, wherein the seventh transistor is connected to the fifth and sixth transistors in a current mirror configuration;
   wherein when the output of the inverter is at a first level, the switching threshold of the first transistor will be determined by the drain current of the sixth transistor alone and wherein when the output of the inverter is at a second level, the fourth transistor will be rendered conductive and the switching threshold of the first transistor will be determined by the drain currents of both the fifth and sixth transistors.

10. A circuit as in claim 9 wherein the control means includes a resistor connected between the drain of the seventh transistor and ground to establish the drain current of the seventh transistor.

11. A Schmitt trigger circuit comprising:
   a first MOS field effect transistor of first conductivity type having its source connected to ground and an input signal applied to its gate;
   a complementary MOS inverter including a second MOS field effect transistor of first conductivity type having its source connected to ground and a third MOS field effect transistor of second conductivity type having its drain connected to the drain of the second transistor and its source coupled to a power supply, wherein the drain of the first transistor is connected to the gates of the second and third transistors and wherein the interconnected drains of the second and third transistors form the output of the inverter which is also the output of the Schmitt trigger circuit;
   a fourth MOS field effect transistor of second conductivity type having its gate connected to the output of the inverter and its drain connected to the drain of the first transistor;
   a fifth MOS field effect transistor of second conductivity type having its drain connected to the source of the fourth transistor and its source coupled to the power supply;
   a sixth MOS field effect transistor of second conductivity type having its drain connected to the drain of the first transistor and its source coupled to be suppled by the power supply; and
   bias means for controlling the value of drain currents of the fifth and sixth transistors, the bias means including a seventh MOS field effect transistor having its source coupled to the power supply and its drain connected to its gate and control means for controlling the drain current thereof, wherein the seventh transistor is connected to the fifth and sixth transistors in a current mirror configuration;
   wherein when the output of the inverter is at a first level, the switching threshold of the first transistor will be determined by the drain current of the sixth transistor along and wherein when the output of the inverter is at a second level, the fourth transistor will be rendered conductive and the switching threshold of the first transistor will be determined by the drain current of both the fifth and sixth transistors;
   wherein the control means includes an eigth MOS field effect transistor of first conductivity type having its drain connected to the drain of the seventh transistor, and its source connected to ground; and
   a voltage divider connected between power supply, ground and the gate of said eighth transistor for providing a predetermined voltage to the gate of the eighth transistor.

12. A circuit as in claim 11 wherein the voltage divider includes first and second resistors connected in series between the power supply and ground, wherein the predetermined voltage is obtained at the connection between the resistors.

* * * * *